United States Patent [19]

Koo et al.

[11] Patent Number: 5,001,671

[45] Date of Patent: Mar. 19, 1991

[54] CONTROLLER FOR DUAL PORTED MEMORY

[75] Inventors: James T. Koo, Los Altos Hills; In-Nan Wu, Sunnyvale; Francis C. Hung, Cupertino; King Wang, Milpitas; Jon C. Zierk, Cupertino, all of Calif.

[73] Assignee: Vitelic Corporation, San Jose, Calif.

[21] Appl. No.: 372,072

[22] Filed: Jun. 27, 1989

[51] Int. Cl.$^5$ .............................................. G11C 8/00
[52] U.S. Cl. ......................... 365/230.05; 365/230.02; 365/233.5
[58] Field of Search ...................... 365/230.05, 230.02, 365/233.5, 233, 230.08

[56] References Cited

U.S. PATENT DOCUMENTS 4,610,004 9/1986 Moller et al. .................. 365/230.02
4,685,088 8/1987 Iannucci ........................ 365/230.02

OTHER PUBLICATIONS

"A 2K×9 Dual Port Memory", Frank E. Barber et al., AT&T Bell Laboratories, Allentown, Pa., 1985 IEEE International Solid-State Circuits Conference.

Primary Examiner—Joseph A. Popek
Attorney, Agent, or Firm—Flehr, Hohbach, Test, Albritton & Herbert

[57] ABSTRACT

The present invention is a controller for producing a dual port function from a single port memory with an improved memory cycle time. An address or control signal transition for one port generates an access request signal for that port. The access request signal both (1) blocks an access request by the other port for its duration and (2) generates a series of signals for a memory access for the selected port. A multiplexer for providing addresses to the memory core from two ports is switched to select a second port while a first port access is in progress. The output of the multiplexer is not enabled until the memory core access is completed. Thus, the set-up time for the second set of addresses is allowed to overlap the memory core access time for the first set of addresses thereby reducing overall cycle time.

20 Claims, 6 Drawing Sheets

TRUE DUAL-ACCESS RAM CELL

FIG.-1

DAUL-PORT RAM MODE FROM SIMPLE RAM CELLS

CONTROLLER FOR DUAL PORTED MEMORY

BACKGROUND

The present invention relates to controllers for producing a dual port function with a standard single port memory device.

Applications for dual port memories are widespread in asynchronously running multi-processor systems. Dual port memories relieve the system engineers of the task of reinventing the arbitration network and multiplexing network that must be placed around standard memory devices to simulate a dual port function. Generally, there are two approaches to the design of monolithic dual port memories. One is made from special memory cells that may incorporate separate read/write controls from both ports. Another design is to have an ordinary memory core with multiplexers and arbitration controllers placed around it directing proper dual port operations between the ports.

Figure 1:
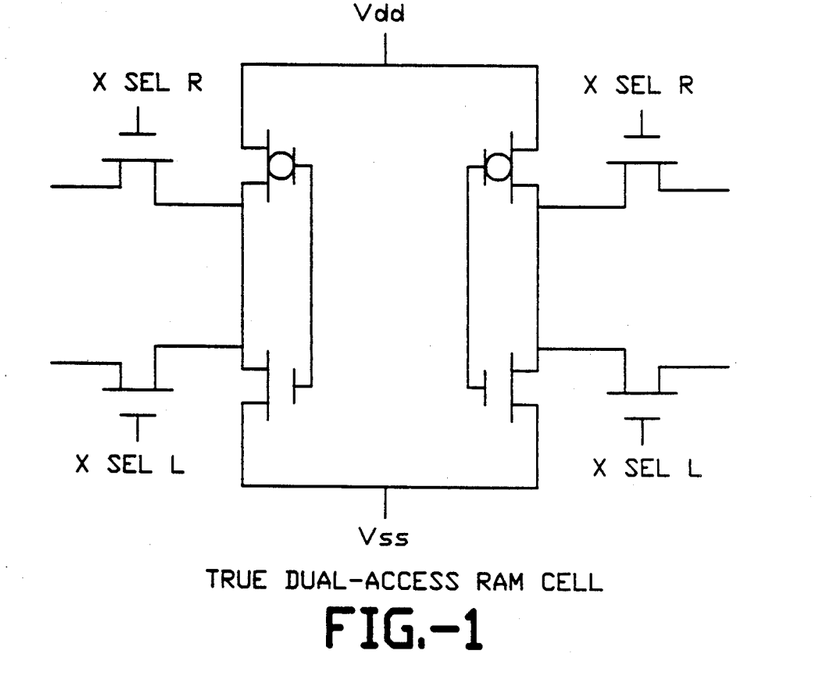
FIG. 1 is a schematic diagram of a prior art dual-access RAM cell.

The first method, a special dual port cell design, shows better performance and has simpler peripheral control than the simulated dual port memory. FIG. 1 shows such a dual-access RAM cell. However, each dual port cell will occupy twice as much silicon as a normal cell. Therefore, for the monolithic integrated circuit design, this approach will be very costly and almost impractical for high density integration.

In the conventional application of the second approach the speed performance of the memory is limited. Each dual-port memory operation cycle has to be split into two internal cycles, enabling one master-contention circuit to handle all the arbitration that controls the multiplexing between ports. Also, because of the asynchronous nature of the dual-port address access, external READ/WRITE request clock signals are required to set up a queuing function. This resolves all the conflicting access requests.

Figure 2:
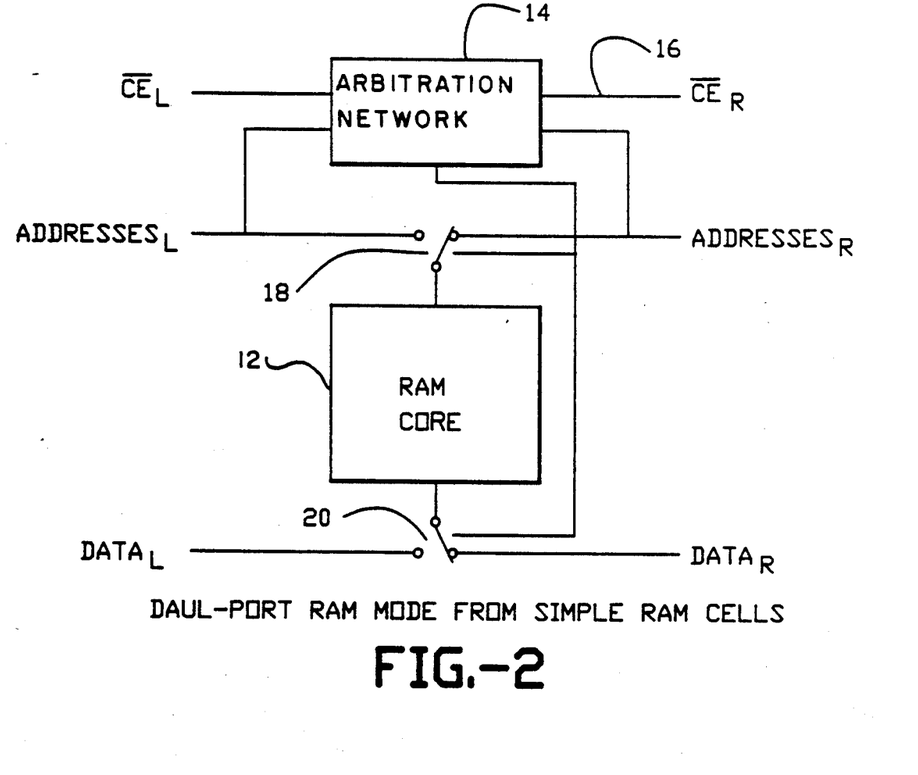
FIG. 2 is a block diagram of a prior art dual-port memory using a single port RAM cell array.

A simulated dual port memory design is shown in FIG. 2. A random access memory (RAM) core 12 with a single port for address and data is shown. An arbitration network 14, upon receipt of a chip enable signal on line 16, couples the right addresses to RAM core 12 through an input switch 18. At the same time, the outputs are coupled to a right data input/output (I/O) line through a switch 20. After a complete read or write cycle, switches 18 and 20 can be reversed to couple to a left address input and a left data I/O.

A memory operation cycle that involves both ports is actually split into two internal cycles. One master contention circuit handles all arbitration and controls the multiplexing between ports. However, in order to set up a queuing function to resolve all the conflicting access requests and to fulfill all the asynchronous access requests from both sides, extra read/write request clocks are required, thus complicating the system. Furthermore, two internal cycles are needed to accomplish a system cycle and thus the speed performance is strictly limited.

An article on one dual port memory is in the 1985 IEEE Solid-State Circuits Conference, entitled "A 2K×9 Dual Port Memory" by Frank Barber, et al., of AT&T. A clocked static RAM is described which needs an external enable signal to initiate an access for either port.

SUMMARY OF THE INVENTION

The present invention is a controller circuit for a special purpose memory which produces an asynchronous dual port function from a single port memory array with an improved memory cycle time. An address on control signal transition for one port generates an access request signal for that port. No separate clock or enable signal is required. The access request signal both (1) blocks an access request by the other port for its duration and (2) generates a series of signals for a memory access for the selected port.

A multiplexer for providing addresses to the memory core from two ports is switched to select a second port while a first port access is in progress. The output of the multiplexer is not enabled until the memory core access is completed. Thus, the set-up time for the second set of addresses is allowed to overlap the memory core access time for the first set of addresses, thereby reducing overall cycle time.

For a write operation, the data is also provided to the data I/O buffer while a memory access from a preceding cycle is in process in the memory core. Additionally, during a read operation, as soon as the data is provided from the memory core to the output data buffer, the access for the other port can commence in the memory core. There is no need to wait for the data to propagate through the output buffer and be driven to the first port.

The internal timing of the present invention is generated by a pipeline control sequencer which generates a sequence of timing signals to the input multiplexer and the I/O buffers in response to an enable signal from a queuing controller. The queuing controller initiates an access and also will terminate the access in certain instances.

The present invention achieves high density, high performance and low cost through an innovative self-arbitration, time-sharing scheme to provide a fully asynchronous dual port memory. The method involves an economic single-ported memory cell array with a multiple-stage pipelined operation control system built around it, allowing simultaneous access with high speed, without any contention-induced wait states. The unique architecture of the control system consists of two access request detectors, a queuing controller, two internal resettable timers, a pipeline-control sequencer and dual port multiplexers, whole individual functions are described below.

For a fuller understanding of the nature and advantages of the invention, reference should be made to the ensuing detailed description taken in conjunction with the accompanying drawings.

DETAILED DESCRIPTION OF THE PREFERRED EMBODIMENTS

Figure 3:
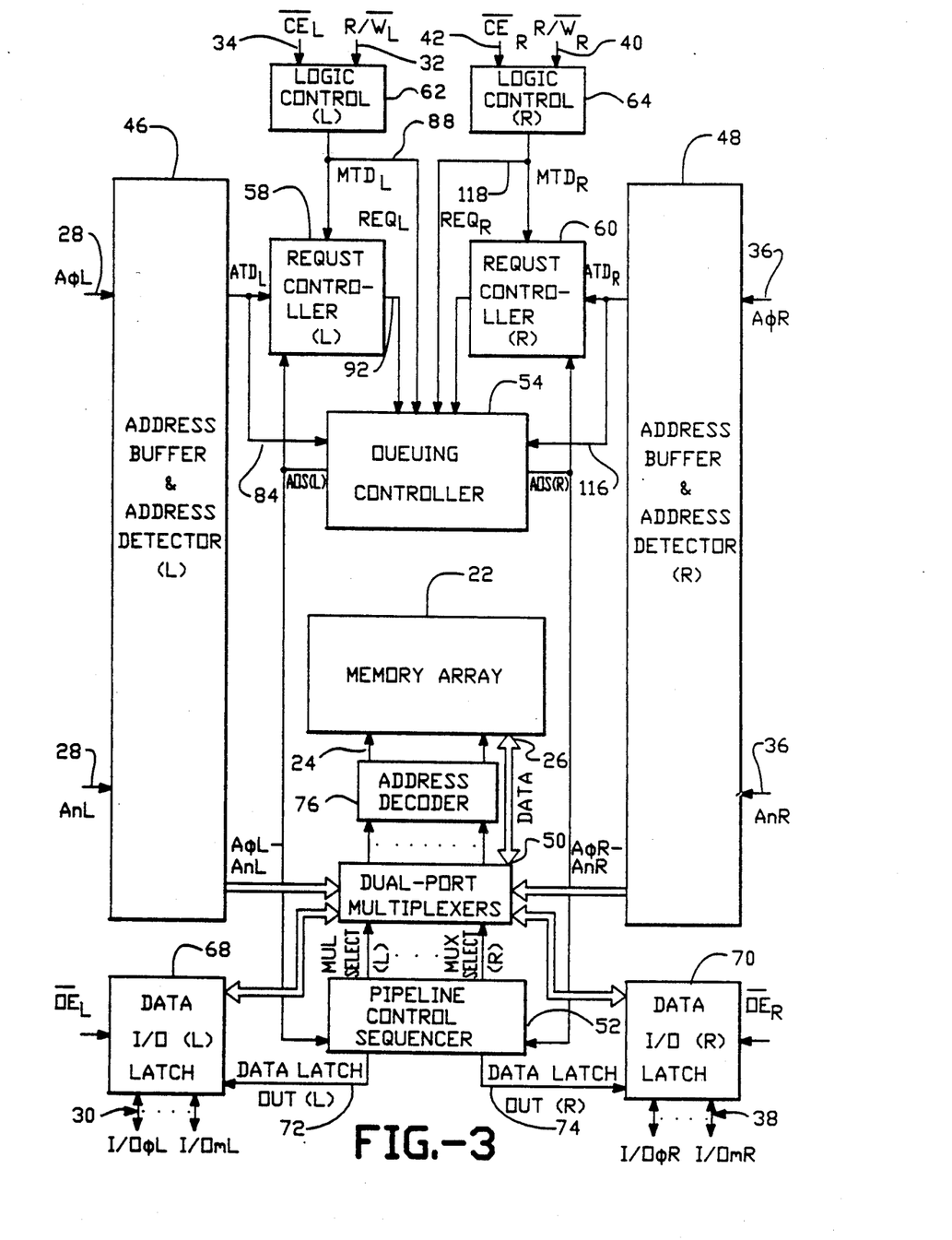
FIG. 3 is a block diagram of a dual-port memory according to the present invention.

FIG. 3 is a block diagram of a dual-port memory control system according to the present invention. A standard memory core array 22 is provided having a single set of address inputs 24 and a single set of data I/O lines 26. The system interfaces to two different ports. A left port uses address lines 28, data I/O lines 30, a read and write ($R/W_L$) line 32 and a chip enable ($CE_L$) line 34. A right port has address lines 36, data I/O lines 38, $R/W_R$ control line 40 and $CE_R$ control line 42.

Address lines 28 and 36 are provided through address buffers and address request detectors 46 and 48, respectively, to a multiplexer 50. Multiplexer 50 controls access to memory array 22. The select and output enable signals for multiplexer 50 are controlled by a pipeline control sequencer 52 which is enabled by a queuing controller 54. Controller 54 responds to access request signals from request controllers 58 and 60. Request controllers 58 and 60 are responsive to control signals indicating address (ATD) or operation mode (MTD) transitions from address buffer, address request detectors 46 and 48, and logic control circuits 62 and 64.

Data bus 26 from memory array 22 is provided through multiplexers 50 to either a data I/O latch 68 for the left side or a data I/O latch 70 for the right side to data lines 30 and 38, respectively. Pipeline control sequencer 52 controls the latch outputs with control signals 72 and 74, respectively. Left and right multiplex select signals are also provided by pipeline control sequencer 52 to multiplexers 50.

As can be seen, while data is being read out of array 22 on data lines 26 for the right side, a left side access can be initiated by providing the address lines through multiplexer 50 to address decoder circuit 76. The timing can be arranged so that the output data will be latched into latch 70 before the addresses propagate through address decoder 76 to array 22.

Figure 4:
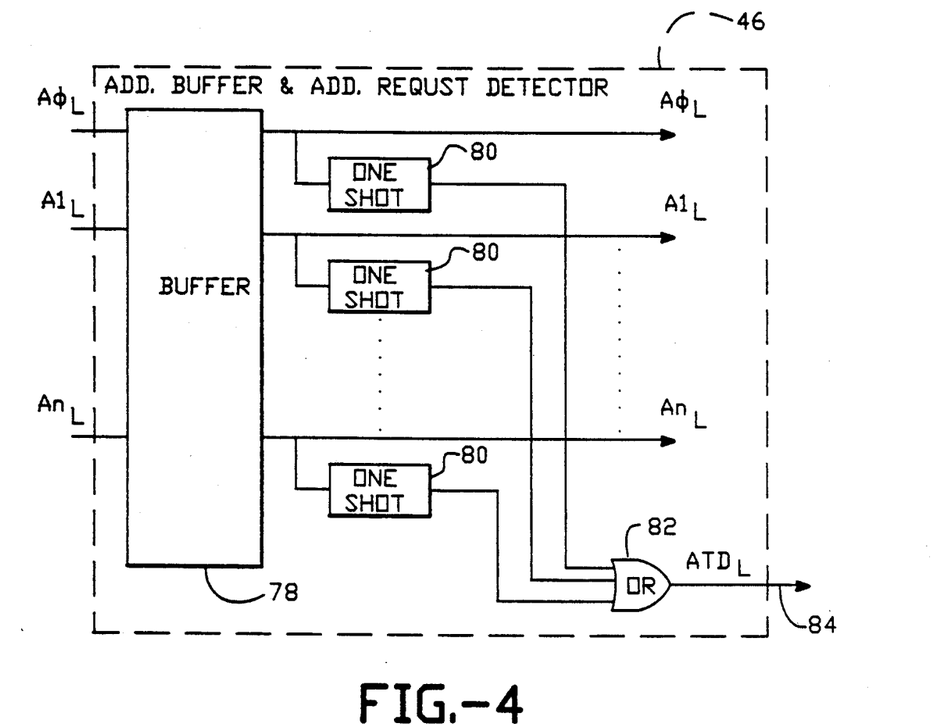
FIG. 4 is a block diagram of the address buffer and the address request detector of FIG. 3.

FIG. 4 is a block diagram of either one of address buffer and address request detectors 46 and 48 of FIG. 3. In particular, it is drawn for address buffer 46. The circuit includes a standard address buffer 78 with each of the outputs being coupled to one of one-shots 80. The outputs of one-shots 80 are wired in an OR fashion as indicated symbolically by OR gate 82 to provide an address transition detect signal 84 ($ATD_L$). Whenever one of the address bit lines experiences a transition, a pulse is generated by one of one-shots 80 to produce a pulse on signal line 84. Thus, a transition of an address is detected.

Figure 5:
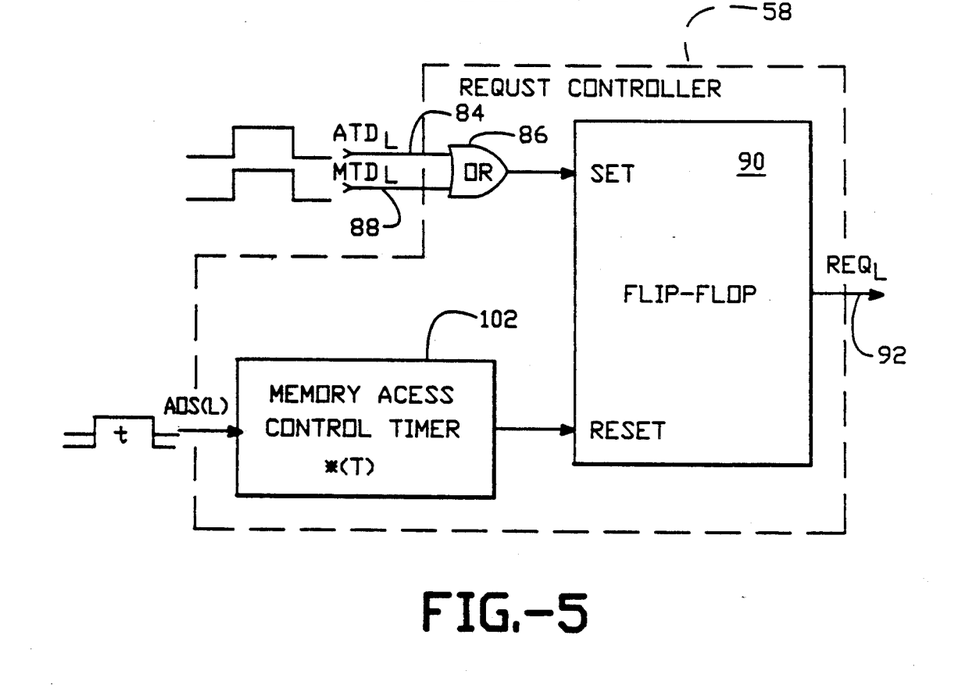
FIG. 5 is a block diagram of a request controller of FIG. 3.

FIG. 5 is a block diagram of request controller 58 of FIG. 3. Request controller 60 is similarly constructed. As can be seen, the $ATD_L$ signal is provided to an OR gate 86 along with the $MTD_L$ signal on a line 88 from logic control circuit 62. Logic control circuit 62 provides a pulse upon a change in state of the chip enable signal to an active state on line 34, or any change of the read/write signal on line 32.

Thus, the transition of an address or any of the control signals will produce a pulse at the output of OR gate 86 to the set input of a flip-flop 90. This will cause the output of flip-flop 90 on line 92 ($REQ_L$) to go high. This signal is then provided to queuing controller 54 as shown on FIG. 3.

Logic control circuits 62 and 64 are constructed with one-shots and OR gates to provide an output pulse upon a transition of CE from inactive to active (normally H to L) and upon and transition of R/W. The OE signal is not used to influence a pulse on lines 88 or 118, but instead controls the state of output buffers 68 and 70.

Figure 6:
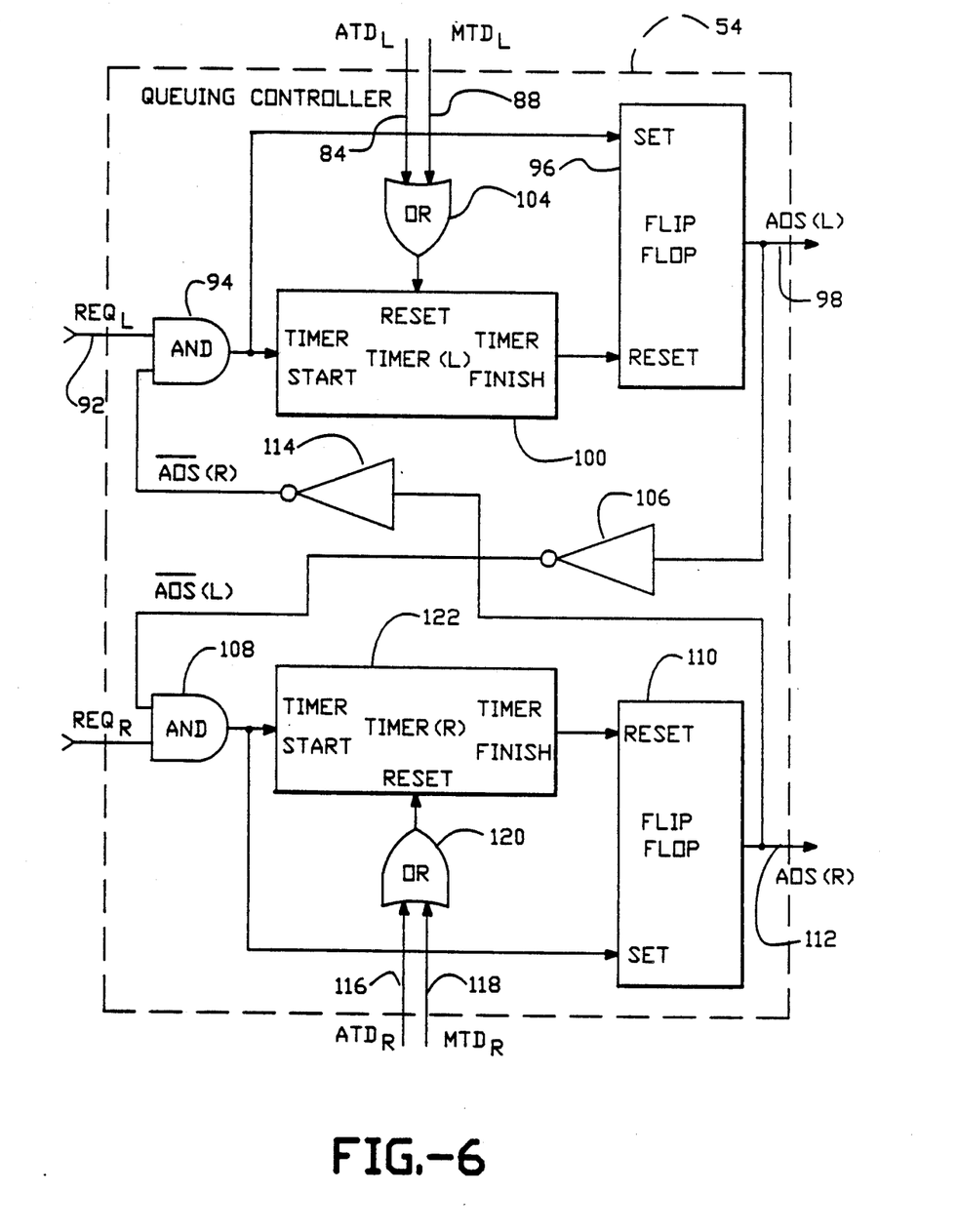
FIG. 6 is a block diagram of the queuing controller of FIG. 3.

Queuing controller 54 is shown in more detail on FIG. 6. As can be seen, the $REQ_L$ signal on line 92 is provided to an AND gate 94. The other input to AND gate 94 will be high if there is no current access on the right side, as will be discussed below. This will set a flip-flop 96, causing its output on line 98, AOS(L), to be high. The AOS(L) signal stays high until flip-flop 96 is reset by a timer 100. Timer 100 is designed to provide a reset signal to flip-flop 96 after a period of time T from the set signal to flip-flop 96 from AND gate 94. Time T is sufficient to allow a memory access for one port.

Returning to FIG. 5, the AOS(L) signal is provided to a memory access control timer 102. This timer is also designed to provide a pulse after a period of time T. Thus, after sufficient time for a memory access, a reset will be applied from the output of timer 102 to flip-flop 90, thereby eliminating the request signal on line 92. This will then allow an access by the other port.

In the event that there is a change in the addresses or the control signals during a memory cycle as indicated by a signal on lines 84 or 88, an abort of the previous cycle will be done and a new time period will be initiated. This is accomplished by an OR gate 104 as shown in FIG. 6 which provides a reset signal to timer 100.

During the time of a memory access by the left port, the high signal on line 98 is provided to an inverter 106 which provides an inverted signal to an AND gate 108 to disable any request from the right side from getting through.

After the completion of a left side access, the signal on line 98 will go low, thus enabling AND gate 108 through inverter 106 as shown in FIG. 6. A high request signal $REQ_R$ will then pass through AND gate 108 to the set input of a flip-flop 110 providing a high output signal on line 102, AOS(R). The AOS signals activate the pipeline control sequencer 52 of FIG. 3 to enable the memory access. In addition, AOS(R) holds off any request from the left port while it is high through an inverter 114 to AND gate 94. Similarly to the left port, addressing control signal transition pulses $ATD_R$ and $MTD_R$ on lines 116 and 118 are provided to an OR gate 120, which is connected to a reset input of a timer 122. Timer 122 performs the same function as timer 100 and provides a signal to the reset input of flip-flop 110.

Figure 7:
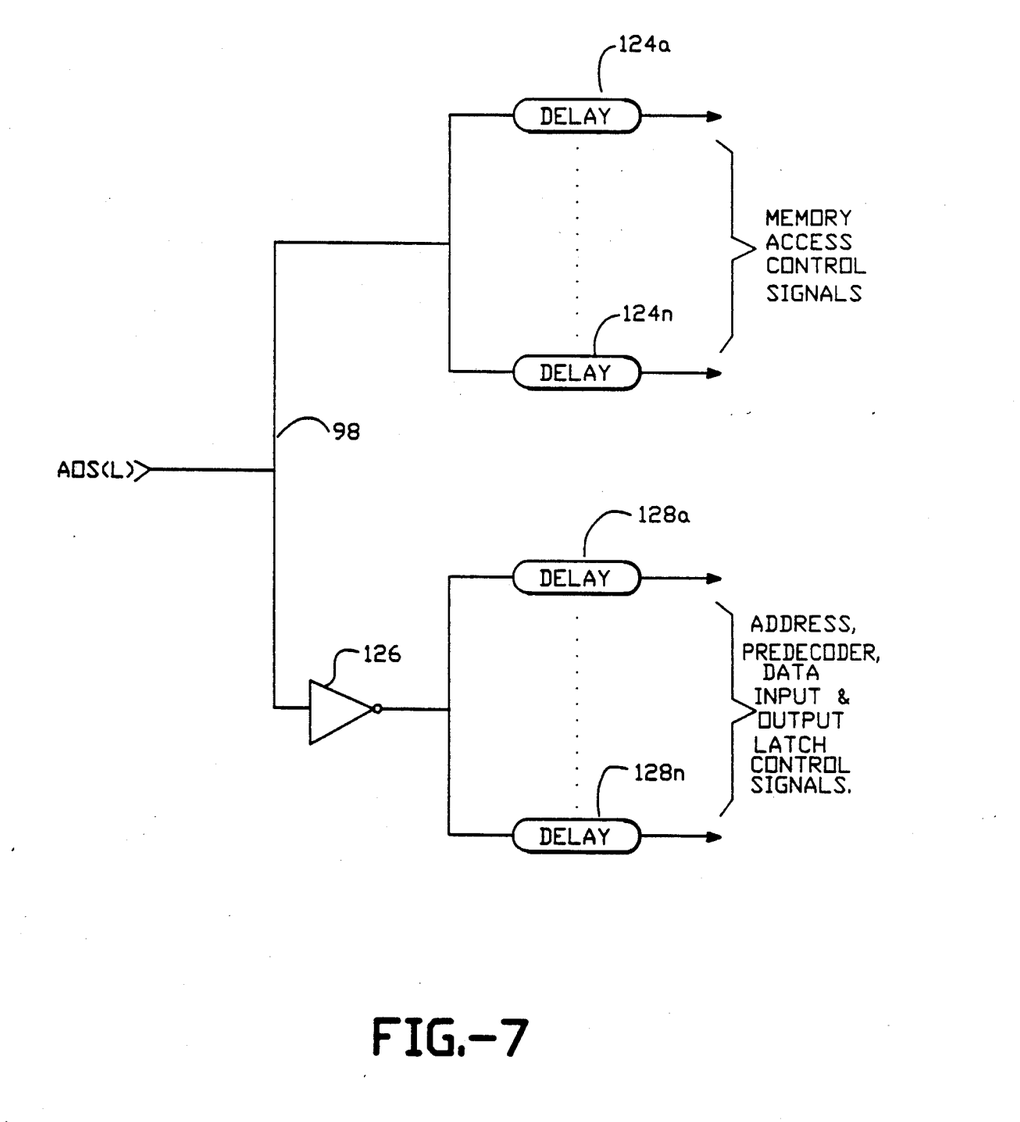
FIG. 7 is a block diagram of the pipeline control sequencer of FIG. 3.

An embodiment of one-half of pipeline control sequencer 52 of FIG. 3 is shown in FIG. 7. In this version, the left side is shown which receives the signal AOS(L) on line 98. This signal is provided through a plurality of delay circuits 124A–124N to provide memory access control signals. AOS(L) is also inverted through an inverter 126 and provided through a plurality of delay elements 128A–128N to provide control signals to address decoder 76 of FIG. 3 and data input and output control signals to data I/O latch 68 of FIG. 3. By appropriate variation of the delay circuits, a pipelined memory access operation can be put in place. While one side is accessing the memory core, the other can decode incoming address signals and/or set up the input data (in the case of a write), or read out desired memory data through output buffers, if the memory core has already been accessed.

Figure 8:
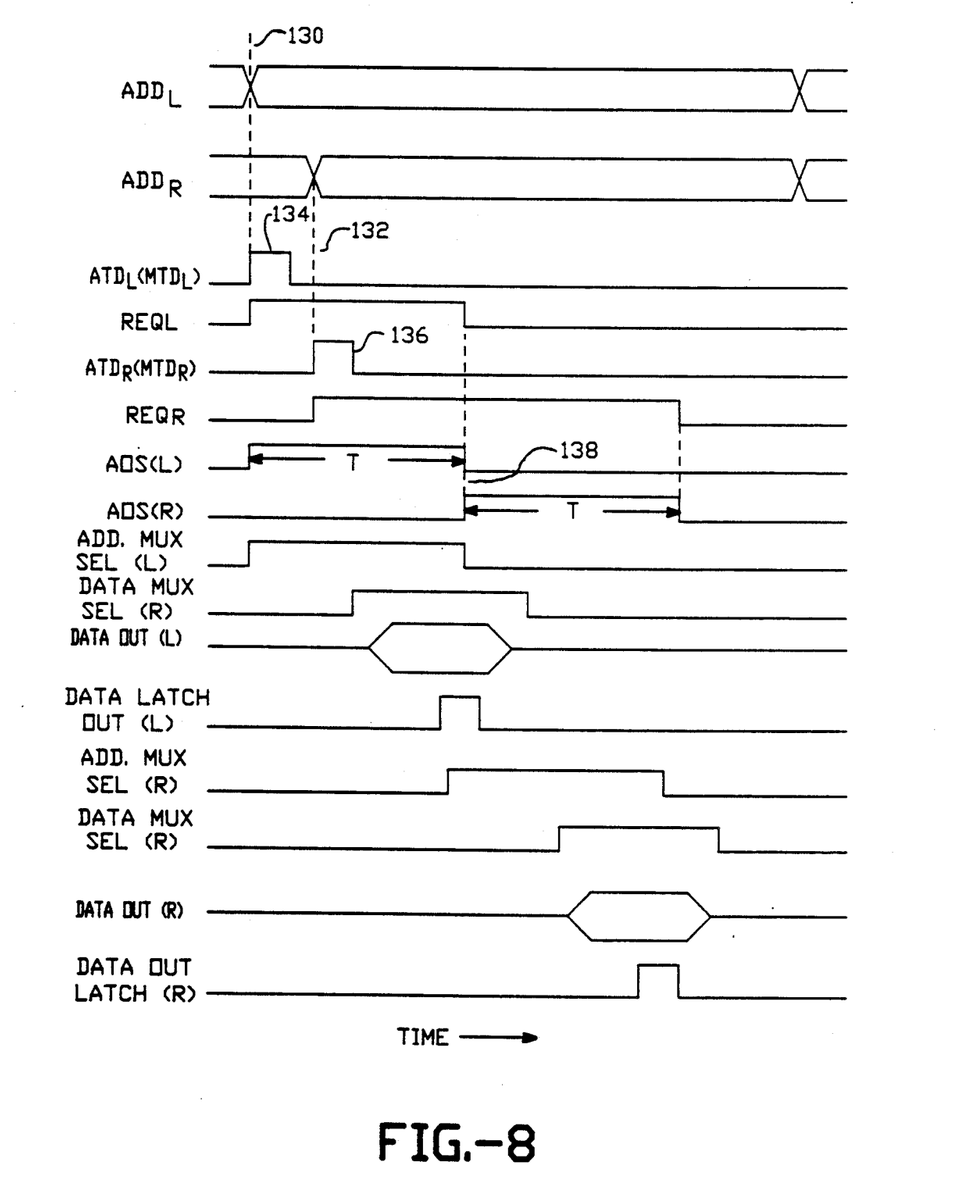
FIG. 8 is a timing diagram for the operation of the circuit of FIG. 3.

FIG. 8 is a timing diagram showing some of the control signals for the present invention. A left side address transition, $ADD_L$ is shown at a time 130 with a right side address transition, $ADD_R$, occurring at a later time 132. The left side transition initiates an address transition detection or control signal detection pulse, $ATD_L$ ($MTD_L$) 134. Similarly, a right side transition pulse 136 is generated by the address transitions on the right side. $REQ_L$ is initiated by pulse 134 and lasts for a period of time T. The AOS(L) signal is generated by the $REQ_L$ signal. An $REQ_R$ signal is generated by pulse 136, but the AOS(L) signal holds it off from generating a pulse signal AOS(R) until a time 138 corresponding to the end of the pulse AOS(L) for a left side memory access. At that point, a pulse AOS(R) is generated which lasts for a length of time T.

If there were subsequent $REQ_R$ signals during the time T of signal AOS(R), such as after a time t from time 136, signal AOS(R) would be extended so that the pulse lasted for a period of time equal to T plus t.

The AOS(L) signal is provided to pipeline control sequencer 52 of FIG. 3. This generates an address multiplexer select signal, ADD MUX SEL(L) which selects the left side address. Some time after that, a DATA MUX SEL(R) signal is provided which lasts beyond the period of time t. The DATA OUT(L) appears for a period of time also extending beyond time T during the DATA MUX SEL(R) signal. This is followed by the left side DATA OUT LATCH(L) and then a corresponding set of timing signals for the left side. It should be noted that the left side data can be read at the output and latched there while the addresses are being provided to the memory core for a right side access.

The specific arrangement of control signals set forth above is simply one example of how the control signals could be pipelined. Other variations are possible. For instance, a single address multiplexer signal could be used with one state enabling the left side and another state enabling the right side. Thus, after one side has been given the addresses for a sufficient period of time, the other side can have its addresses multiplexed through with simply a sufficient delay to allow the first side to complete its access. Thus, the address multiplexer could enable the addresses to pass through before the appearance of the AOS signal.

The pipeline control sequencer could also be influenced by read/write signals to vary the timing depending upon whether a left side read is followed by a right side write or a right side read signal. Obviously, for a read following a write, the data input of the write must be completed before the data is available to be read from the other side.

The read/write and other control signals are obviously provided to the memory array in FIG. 3 in the typical manner, but are not shown for simplicity.

An access of memory by the circuit of FIG. 3 is divided into three segments. The first is the front end address set-up and address decoding. The second is the memory core access itself and the associated signal development. The third is the data input/output buffering. Since separate address and I/O buffers are provided with appropriate multiplexers, only the second segment is shared. Accordingly, the address set-up and the data input or output for one port can be proceeding while a memory core access is proceeding for the other port.

As can be seen, the timing of the present invention is faster than the prior art which would require the data output latch to be completed prior to the multiplexer selection of the other port.

One of the advantages of the present invention is illustrated in the following example. Assume a single port memory of 100 ns access time is to be used for constructing a time-shared dual port device. Assume no pipeline, i.e. one side will not access until the other side finishes (i.e. 100 ns). If A port starts at 0 ns, and B port starts at 10 ns, then A port will get its data at 100 ns and B port will get its data at 200 ns. That is, one can realize a 200 ns dual port device with a 100 ns single port device. This will be a typical contention case for a clocked dual port memory device to resolve. Now, we allow A port to change its addresses at 20 ns (this is allowed for a non-clocked or "asynchronous" device). Then the memory device will still provide the unwanted data to A port at 100 ns (from the addresses before the change), correct data to B port at 200 ns, and correct data to A port at 300 ns. That is, in addition to providing incorrect data to A port between 100 and 300 ns, the access time for A port is degraded to 280 ns (300-20). Using the circuit described in this application, the timing circuit is immediately reset at 20 ns and starts the access for B port. Thus, correct data for B port is available at 120 ns, and for A port at 220 ns, with an access time of 200 ns. This is an improvement of 80 ns over the prior art.

There are three different modes of operation: Standby mode, Turbo mode and Dual Port mode.

In the Standby mode, when both sides are not activated, the circuit is powered-down. The cell array and I/O buffers are shut off to save the power.

In the Turbo mode, only one port is activated. The queuing controller assigns the core access to that port. The internal timers are shut off, and all the multiplexers are dedicated to serve this port. The device works like a single-ported memory, with slightly less than half of the normal dual port operating cycle time. This allows fast access operation on this port.

In the dual port mode, both ports are activated and the queuing function is activated. An access request is triggered by an address transition or operation changes in one port while that port is not being served. The queuing controller will assign the right to access to this port after the other port finishes. When one port gets access to the core and successfully finishes an internal operation cycle counted by the internal timer, the queuing controller will either grant the access right to the other port if the request has been set up or will shut down the array to wait for the next access request from either port.

As will be understood by those familiar with the art, the present invention may be embodied in other specific forms without departing from the spirit or essential characteristics thereof. Accordingly, the disclosure of the preferred embodiment of the invention is intended to be illustrative, but not limiting, of the scope of the invention which is set forth in the following claims.

What is claimed is:

1. A method for providing dual port access to a memory array having a multiplexer with an output coupled to an address input of the memory array for providing one of two addresses from first and second ports to the memory array and a pair of output buffers coupled to a data input/output of the memory array, comprising the steps of:

asserting a first port access signal in response to a transition of address and/or control signals of said first port;

providing in response to said first port access signal, a first series of control signals to allow a memory access by said first port, said first series of control signals including a select signal for selecting a first address input to said multiplexer;

asserting a second port access signal in response to a transition of address and/or control signals of said second port, said second port access signal being delayed while said first port access signal is asserted, said first port access signal being delayed while said second port access signal is asserted; and providing, in response to said second port access signal a second series of control signals to allow a memory access by said second port, including selecting a second address input to said multiplexer.

2. A dual port memory comprising:
a memory array;
a first port having first address and data lines;
a second port having second address and data lines;
a multiplexer for coupling one of said first and second ports to said memory array;
a first port access request circuit for producing a first port access request signal in response to a signal transition on one of said first address lines or a first port control signal line;
a second port access request circuit for producing a second port access request signal in response to a signal transition on one of said second address lines or a second port control signal line; and
a queuing controller for generating control signals to said multiplexer and said memory array to provide access to said memory array to said first port access signal and to said second port in response to said second port access signal.

3. The dual port memory of claim 2 wherein each of said first and second port access request circuits include a timer for terminating said first and second access request signals, respectively, a predetermined amount of time after initiation of access to said memory array for said first and second port, respectively.

4. The dual port memory of claim 3 wherein said first port access request circuit includes:
a flip-flop having an output coupled to said queuing controller and having set and reset inputs;
an OR logic circuit having an output coupled to said set input of said flip-flop and having inputs for receiving signals indicating transitions on said first address line and said first port control signal line; and
said timer having an output coupled to said reset input of said first flip-flop and an input coupled an output of said queuing controller.

5. The dual port memory of claim 2 wherein said queuing controller includes:
a first flip-flop for producing a left port access control signal and having set and reset inputs;
a first timer having an output coupled to a reset input of said flip-flop;
a second flip-flop having an output for providing a right access control signal and having set and reset inputs;
a second timer having an output coupled to a reset input of said second flip-flop;
a first AND logic circuit having an output coupled to an input of said first timer and having first and second inputs coupled to an output of said first port access request circuit and said second flip-flop, respectively; and
a second AND logic circuit having inputs coupled to an output of said second port access request circuit and said first flip-flop output, respectively.

6. The dual port memory of claim 5 further comprising:
a first OR logic circuit having an output coupled to a reset input of said first timer and having inputs for receiving signals indicating signal transitions on said first address lines and said first port control signal line, respectively; and
a second OR logic circuit having an output coupled to a reset input of said second timer and having first and second inputs for receiving signals indicating a transition on said first address lines and said first port control signal line.

7. The dual port memory of claim 5 further comprising:
a first inverter coupled between an output of said first flip-flop and an input of said second AND logic circuit; and
a second inverter coupled between an output of said second flip-flop and an input of said first AND logic circuit.

8. The dual port memory of claim 2 further comprising:
an address buffer having inputs coupled to said first address lines;
a plurality of one-shot circuits, each having an input coupled to an output of said address buffer; and
an OR logic circuit having a plurality of inputs coupled to outputs of said one-shot circuits and having an output for producing a signal indicating the transition on an address line.

9. The dual port memory of claim 2 further comprising a pipeline control sequencer circuit having inputs coupled to said queuing controller and outputs coupled to said multiplexer for providing select signals to said multiplexer in response to said control signals from said queuing controller to provide access to said memory array to one of said first and second ports.

10. A memory circuit comprising:
a memory array including an address bus and a data bus;
a first port including first address and data lines;
a second port including second address and data lines; and
controller means for,
a. first coupling data lines of one of said first port and said second port to provide exclusive access to said data bus and for then coupling data lines of the other of said first port and said second port to provide exclusive access to said data bus, and
b. coupling said address lines of the other port to provide access to said address bus in the course of the coupling of said data lines of the one port.

11. The memory circuit of claim 10 wherein said controller means includes queuing controller means for ordering accesses to said address bus by said first port and said second port.

12. The memory circuit of claim 10 and further including:
request controller means for providing respective requests for memory access through said first port and through said second port;

wherein said controller means includes queuing controller means responsive to said request controller means for ordering requests for access to said address bus through said first port and through said second port such that access is provided on a first to request first to receive access basis.

13. The memory circuit of claim 10 wherein said controller means further includes:
means for ordering respective accesses to said address bus through said first port and said second port; and
means for prescribing the duration of respective time intervals during which either of said first address lines and said second address lines are coupled to provide access to said address bus such that each respective time interval is sufficient to allow set-up for only one memory access.

14. The memory circuit of claim 10 and further including:
request controller means for providing respective requests for memory access through said first port and through said second port;
wherein said controller means includes means for ordering respective accesses to said address bus through said first port and said second port such that access is provided on a first to request first to receive access basis; and
wherein said controller means further includes timer means for prescribing the duration of respective time intervals of accesses to said address bus such that each respective access is sufficient to allow set-up for only one memory access.

15. The memory circuit of claim 10 and further including:
request controller means for providing respective requests for memory access through said first and through said second port;
wherein said controller means includes queuing controller means responsive to said request controller means for ordering accesses to said address bus through said first port and said second port such that access is provided on a first to request first to receive basis; and
wherein said controller means further includes sequence controller means for sequencing the coupling of said first and said second data lines to provide access to said data bus and for sequencing the coupling of said first and said second address lines to provide access to said address bus such that data access to said memory array through either one of said first and second ports can proceed in the course of address set-up of said memory array for data access through the other of said first and second ports.

16. A method for providing access to a dual port memory array which includes an address bus and a data bus and first and second ports for accessing the address bus and the data bus, and request means for providing respective requests for access to the memory array, the method comprising the steps of:
receiving respective requests for access to the memory array through the first port and through the second port;
ordering the respective requests for access in a prescribed order;
in accordance with the prescribed order, coupling data lines first of one of the first and second ports to provide exclusive access to the data bus and then coupling data lines of the other of the first and second ports to provide exclusive access to the data bus;
in the course of said step of coupling the data lines of the one port, coupling address lines of the other port to provide access to the address bus.

17. The method of claim 16 wherein said step of ordering involves ordering of respective requests on a first to request first to receive access basis.

18. The method of claim 16 and further including the step of:
before said step of coupling the data lines of the one port, coupling address lines of the one port to provide access to the address bus.

19. The method of claim 16 and further including the step of:
before said step of coupling the respective data lines of the one port, coupling address lines of the one port to provide access to the address bus;
before said step of coupling the address lines of the other port, uncoupling the address lines of the one port.

20. The method of claim 19 wherein said step of coupling data lines of the one port overlaps said steps of coupling the address lines of the one port and of coupling the address lines of the other port.

* * * * *